United States Patent [19]

Smith et al.

[11] Patent Number: 5,034,373

[45] Date of Patent: Jul. 23, 1991

[54] PROCESS FOR FORMING SUPERCONDUCTOR PRECURSOR

[75] Inventors: Gaylord D. Smith; Jon M. Poole, both of Huntington, W. Va.; Marvin G. McKimpson, Houghton, Mich.; Lawrence J. Masur, Newton; Kenneth H. Sandhage, Randolph, both of Mass.

[73] Assignees: Inco Alloys International, Inc., Huntington, W. Va.; American Superconductor Corporation, Watertown, Mass.

[21] Appl. No.: 455,573

[22] Filed: Dec. 22, 1989

[51] Int. Cl.$^5$ ............................................. H01B 12/00
[52] U.S. Cl. ............................................. 505/1; 419/21; 419/33; 419/36; 419/38; 419/39; 419/42; 419/49; 419/54
[58] Field of Search .................. 505/1; 419/21, 33, 36, 419/38, 39, 42, 49, 54

[56] References Cited

U.S. PATENT DOCUMENTS

| | | | |
|---|---|---|---|
| 4,729,801 | 3/1988 | Togano et al. | 148/133 |
| 4,746,373 | 5/1988 | Yamada et al. | 148/11.5 |
| 4,826,808 | 5/1989 | Yurek et al. | 505/1 |
| 4,929,596 | 5/1990 | Meyer et al. | 505/1 |
| 4,962,084 | 10/1990 | de Barbadillo, II et al. | 419/19 |
| 4,962,085 | 10/1990 | de Barbadillo, II et al. | 505/1 |
| 4,968,663 | 11/1990 | Whang | 505/1 |

FOREIGN PATENT DOCUMENTS 8810010 12/1990 Fed. Rep. of Germany.
3265853 11/1988 Japan.

OTHER PUBLICATIONS

Matsuzaki et al., "Preparation of a High $T_c$ Superconductor by Oxidation of an Amorphous $La_{1.8}Sr_{0.2}$ Cu Alloy Ribbon in Air", Japanese Journal of Applied Physics, vol. 26, No. 4, Apr. 1987, pp. L334–L337.

Yurek et al., "Superconducting Microcomposites by Oxidation of Metallic Precursors", Journal of Metals, Jan. 1988, pp. 16–18.

Primary Examiner—Robert L. Stoll
Assistant Examiner—Nina Bhat
Attorney, Agent, or Firm—Francis J. Mulligan, Jr.; Edward A. Steen; Blake T. Biederman

[57] ABSTRACT

The invention provides a process for production of silver-containing precursor alloys to oxide superconductors, said alloys having reduced amounts of intermetallics. Powders containing metallic elemental components of an oxide superconductor are high energy milled for a predetermined amount of time to increase homogeneity of the mixed metallic elemental components of the oxide superconductor. Silver is then high energy milled into the metallic components. The mixed silver and metallic elemental components of the oxide superconductor are compacted for the silver-containing superconductor precursor. The compacted powder is preferably hot worked at a temperature of at least 50% of the precursor alloy's melting temperature in degrees Kelvin.

20 Claims, No Drawings

PROCESS FOR FORMING SUPERCONDUCTOR PRECURSOR

TECHNICAL FIELD

The present invention is concerned with processing materials into a superconductor. More particularly, this invention provides a method of forming difficult to work oxide or ceramic-like superconductor precursors.

BACKGROUND OF THE ART AND PROBLEM

Several materials and compounds have been discovered to be superconducting. Superconductors have been proposed to serve in a variety of applications. These applications include motor windings, superconducting cables, test coils, actuators, magnetostrictor coils and vapor-cooled leads. However, many of these superconducting materials which apparently carry current with electron holes or in some cases with electrons are extremely difficult to work into useful configurations. Superconductors are generally formed of relatively brittle materials such as ceramic, ceramic-metal compounds (cermets) and metal oxides which are inherently difficult to form into practical and useful shapes.

A quick survey of the recent technical literature through Chemical Abstracts has indicated that the following oxide materials including compounds, phases, mixtures, doped materials, etc. have been proposed for superconducting use:

$YBa_2Cu_3O_{7-x}$
$MBa_2Cu_3O_7$ M=Nd, Dy, Er, Tm or mixtures
$MBa_2Cu_3O_6$ M=Sa, Ho
$La_{2-x}Sn_xCuO_4$
$La_2CuO_4$ doped with fluorine
$YBa_2Cu_3O_{6.8}$ doped with fluorine
$EuBa_2Cu_3O_{9-x}$
$EuBa_2(Cu_{1-y}M_y)_3O_{9-x}$ M=Cr, Mn, Fe, Co, Ni or Zn
$GdBaCu_3O_{7-x}$
$Ba_2SmCu_3O_{9-x}$
$InSnO_2$
$La_{2-x}M_xCuO_4$
$La_{2-x}Sr_xCuO_4$
$Ba_2YCu_3O_{9-y}$
$GdBa_2Cu_3O_{7-x}$
$YBa_2(Cu_{1-x}Fe_x)_3O_{7-y}$
$(Y_{1.2}Ba_{0.8})_4Cu_4O_{16-x}$
$YBa_3Cu_3O_yF_x$
$Y_{3-x}Ba_xCu_2O_{7-y}$
Bi—Sr—Cu—O system
$La_{3-x}Ba_{3-x}Cu_6O_{14-y}$
$YBa_2Cu_3O_{7-x}S_y$
$EuBa_2Cu_3O_x$
$YBa_2Cu_3O_{9-y}$
$La_{1.85}Sr_{0.15}CuO_4$
$Ba_2RCu_3O_x$ R=Gd, Ho, Er or Dy
$YBa_2(Cu_{1-x}Ag_x)_3O_{7-y}$
$YBa_2(CuO_{0.94}FeO_{0.06})_3O_{9-y}$
$YBa_2Ag_3O_x$
$La_2CuO_{4-y}$
$Dy_xBa_{1-x}CuO_{3-y}$
Molybdenum Oxides and Bronzes-Alkali Molybdenum Bronze
Nb, Si, Al oxides Japanese Pat. Appln. No. 87-170,108
Ge, Al, Nb oxides Japanese Pat. Appln. No. 87-171,924
$BaPb_{1-x}Bi_xO_3$
$Nb/Al—Al_2O_3$
$Nb/Ge—Al—O$
Pb, Bi, In oxides
$Li_{1-x}Ti_{2-x}O_4$ $$\left. \begin{array}{l} TlCaBa_2CuO_{8+x} \\ TlCa_2Ba_2Cu_3O_{10+x} \end{array} \right\} \text{where } x = 1$$

Proposed methods of forming superconductors include grinding oxide into ultrafine particles and extruding the ultrafine particles and applying a binder to superconducting materials or precursors to hold material together during a forming process. The problems with the ultrafine particles include cost of reducing the size of the particles, low strength and excessive number of grain boundaries which limit superconductivity. The problems with using binders include the contamination remaining from binders which are not completely removed during sintering, low strength and complex processing techniques.

An alternative and successful method of preparing superconductor materials comprises producing by energetic milling of metallic powder a precursor alloy and oxidizing the precursor alloy into a superconducting material. A method of oxidizing the precursor is described in U.S. Pat. No. 4,826,808 ('808). Formed precursor alloys have been successfully heat treated according to the oxidizing procedure of the '808 patent to produce superconducting wire. However, difficulties have arisen in the steps of energetic milling metal powder to produce oxide superconductor precursor alloy and forming of the precursor alloy. The difficulty entails the in situ difficult to work, brittle intermetallics phases. During high energy milling of silver with elemental components of an oxide superconductor, a variety of intermetallics may be formed. For example, high energy milling Ag, Ba, Cu and Y powders together, intermetallics formed have included $Ag_5Ba$, $Cu_5Ba$, $AgY$, $Ag_6Y$, $CuY$, $Cu_4Y_2$, $Cu_4Y$ and $Cu_6Y$. These intermetallics impair ductility and increase difficulty in working or forming the precursor alloy into a desired shape.

It is an object of this invention to provide a method of producing metallic, superconductor precursors which limits the amount of ductility decrease from the formation of non-ductile compounds or phases.

It is a further object of this invention to provide a method of mechanical forming of non-ductile superconductor precursors.

It is a more particular object of this invention to provide a method of forming 1-2-3 Y-Ba-Cu precursor into useful shapes such as wires.

SUMMARY OF THE INVENTION

The invention provides a process for production of silver-containing superconductor precursors having reduced amounts of intermetallics. Powders containing metallic elemental components of an oxide superconductor are high energy milled for a predetermined amount of time to increase homogeneity of the metallic elemental components of the oxide superconductor. Silver is then high energy milled into the metallic components. The mixed silver and metallic elemental components of the oxide superconductor are compacted to provide the silver-containing precursor alloy. The compacted alloy powder is preferably hot worked at a temperature of at least 50% of the precursor alloy's melting temperature in degrees Kelvin.

DESCRIPTION OF PREFERRED EMBODIMENT

The invention utilizes several processing steps to produce high critical temperature ($T_c$) superconductors into useful shapes, such as a superconducting coil having a 100 amp-turn capacity. The process of the invention involves high energy milling or preferably mechanical alloying to produce a silver-containing precursor alloy for oxide superconductors. For purposes of the invention, mechanical alloying is defined by milling powder as described in U.S. Pat. Nos. 3,740,210; 4,600,556; 4,623,388; 4,624,705; 4,643,780; 4,668,470; 4,627,659; 4,668,284; 4,557,893 and 4,834,810. The workability of the oxide superconductor precursor is related to the distribution and quantity of intermetallics contained within the oxide superconductor precursor. Initial tests with 1-2-3 Y-Ba-Cu oxide superconductor precursor provided less than desirable results. Silver was added to the 1-2-3 Y-Ba-Cu oxide superconductor precursor to increase ductility. In addition, silver reduced the reactivity of precursor powders and increased homogeneity during milling. In some cases, silver may be a part of a superconductor precursor. However, high energy milling of a silver containing 1-2-3 Y-Ba-Cu oxide superconductor precursor was found to produce excess intermetallics, which adversely affected precursor ductility. When processing 1-2-3 Y-Ba-Cu powders, in combination with silver, extensive silver and copper containing intermetallics may tend to form. The silver and copper containing intermetallics formed were believed to consist of a combination of $Ag_5Ba$, $Cu_5Ba$, $AgY$, $Ag_6Y$, $CuY$, $Cu_4Y_2$, $Cu_4Y$ and $Cu_6Ba$.

It has been discovered that high energy milling, and preferably mechanical alloying, may be conducted as a two-step process to significantly decrease the intermetallics formed. The first step involved high energy milling of the metallic components of an oxide superconductor precursor, such as yttrium, barium and copper powder to produce a more homogenous powder mixture. It is highly advantageous to mechanically alloy the metal powders for a more homogeneously distributed powder mixture. The second step of the invention involved adding silver to the precursor alloy powder to mix the silver into the powder. The second mixing step is preferably conducted only for a period of time sufficient to distribute the silver throughout the precursor alloy powder. Excess high energy milling or mechanical alloying may result in the undesired formation of unnecessary additional brittle silver-containing intermetallics. Although the formation of silver-containing intermetallics are not totally eliminated, the amount of intermetallics formed is significantly reduced by means of the invention. The reduction of silver-containing intermetallics was found to significantly increase the workability of the silver-containing superconductor precursor. The high energy milling technique of the invention also reduced the number of cracks in the precursor alloy which, after oxidation, reduced superconducting $I_c$.

Initially, silver-containing superconductor precursors were canned under argon atmosphere within a silver sheath. 1-2-3 Y-Ba-Cu powders mixed with about 40, 60 and 75% silver by weight were pressed into a silver sheath to form test billets. Several problems occurred during drawing and/or rolling of the test billets through conventional dies and/or rolls. After drawing, final products consisted of silver sheathed wire products as thin as 0.047 in. (0.12 cm) in diameter. However, the final products had poor density and extensive cracking. The cracking included transverse cracks and even occasional longitudinal cracks. In addition, the silver sheath had a tendency to preferentially deform, rather than the silver-containing precursor alloy core.

Hydrostatic extrusion was then tested as an alternative method of reducing a silver sheath containing a superconductor precursor into wire. Powder preparation initiated with a charge calculation of the atomic ratio of 1-2-3 Y-Ba-Cu superconductor. Additions ranging from 0-80 weight percent silver powder were added to the yttrium, barium and copper powder to form 10 gram charges. The powder charges were weighed in a high purity argon atmosphere. Materials utilized included $-40$ mesh ($-420$ micron) Y powder, $-100$ mesh ($-149$ micron) Cu powder, $-100$ mesh ($-149$ micron) Ag powder and $-0.75$ in. ($-1.9$ cm) Ba pieces which were charged within a Spex mill container. Spex is a tradename of Spex Industries, Inc. used for describing a high speed shaker mill. High energy Spex milling was carried out for 22 hours in a 65.2 cm$^3$ chamber with three 0.5 in. (1.3 cm) diameter steel balls. For samples 9–14, $-100$ mesh ($-149$ micron) silver powder was added after milling the 1-2-3 Y-Ba-Cu powder for 21 hours. Samples 9–14 were then high energy Spex milled an additional hour for a total of 22 hours of high energy milling. Sample 17 was high energy Spex milled without silver for 22 hours. Silver powder was then added to sample 17. A one minute high energy Spex milling was then applied to sample 17. After high energy Spex milling, the powders were cold compacted in an argon atmosphere into silver sheaths. The silver sheaths had an outer diameter of 0.62 in. (1.6 cm), a core diameter of 0.32 (0.8 cm) to 0.50 in. (1.3 cm), a length of 1.6 in. (4.1 cm) to 3.8 in. (9.6 cm), an internal core length of 1.25 in. (3.2 cm) to 2.8 in. (7.1 cm), and sheath thicknesses of 0.06 in. (0.15 cm) and 0.15 in. (0.38 cm). Sample 14 was compacted in an evacuated chamber. The silver sheath was then plugged with a silver plug and sealed by tungsten inert gas (TIG) welding to form a billet. Billets were prepared for hydrostatic extrusion by machining a conical point on one end of each billet to facilitate contact between the billet and the die of a hydrostatic extrusion press. The prepared billets were then charged into an extrusion press operated at various temperatures, pressures and die sizes. The results of the testing are shown below in Table 1.

TABLE 1

| Sample No. | Silver Content (wt. %) | Sheath Thickness (cm) | Temp. (°C.) | Die Dia. (cm) | Extrude Ratio | Extrude Force (N × 10$^3$) | Comments |
| --- | --- | --- | --- | --- | --- | --- | --- |
| 1* | 40 | 0.15 | 288 | .32 | 24.6 | — | Excellent |
| 2 | 40 | 0.15 | 288 | .64 | 6.0 | 98 to 67 | Good |
| 3 | 40 | 0.15 | 288 | .47 | 11.0 | 108 to 88 | Good |
| 4 | 40 | 0.15 | 149 | .64 | 6.0 | 108 | Cracks, Fair |

TABLE 1-continued

| Sample No. | Silver Content (wt. %) | Sheath Thickness (cm) | Temp. (°C.) | Die Dia. (cm) | Extrude Ratio | Extrude Force (N × 10³) | Comments |
|---|---|---|---|---|---|---|---|
| 5 | 40 | 0.15 | 168 | .64 | 6.0 | 157 to 108 | Cracks, Fair |
| 6 | 60 | 0.15 | 149 | .64 | 6.0 | 137 to 108 | Cracks |
| 7 | 75 | 0.15 | 201 | .47 | 11.0 | 98 to 157 | Broke, Cracks |
| 8 | 75 | 0.15 | 149 | .64 | 6.0 | 118 to 167 | Cracks |
| 9 | 0 | 0.15 | 316 | .20 | 63.0 | — | Broken |
| 10 | 20 | 0.15 | 316 | .20 | 63.0 | 314 | Excellent |
| 11 | 40 | 0.15 | 316 | .20 | 63.0 | 245 | Excellent |
| 12 | 80 | 0.15 | 316 | .20 | 63.0 | 216 | Excellent |
| 13 | 40 | 0.38 | 316 | .20 | 63.0 | 235 | Excellent |
| 14** | 40 | 0.38 | 316 | .20 | 63.0 | 235 | Excellent |
| 15 | 40 | 0.38 | 316 | .16 | 97.0 | — | Excellent |
| 16 | 40 | 0.38 | 316 | .12 | 174.0 | — | Excellent |
| 17 | 80 | 0.38 | 316 | .12 | 174.0 | — | Excellent |

*Sample 1 was extruded to a hexagonal shape.
**Sample 14 was evacuated.

Extrusion load forces were increased by higher reduction ratios, lower temperatures and lower silver content. Decreasing silver content from 40 to 20 weight percent increased the extrusion load by approximately 25%. The preferred extrusion results were obtained when using samples in which silver powder was added in a second step, extruding at temperatures above 288° C. and extruding at an extrusion rate of 10 in. (25.4 cm) per minute. Most preferably, the extrusion temperature is 316° C. or above.

Table 2 below illustrates chemical analysis data for a few selected samples.

TABLE 2

| Sample No. | Mole Fraction | | | Weight Percent | | | | |
|---|---|---|---|---|---|---|---|---|
| | Y | Ba | Cu | Ag | Si | Fe | Ca | Sr |
| 1 | 1.00 | 2.02 | 3.00 | 40.2 | 0.02 | 0.14 | 0.04 | 0.23 |
| 10 | 1.01 | 1.88 | 3.00 | 20.5 | 0.02 | 0.08 | 0.04 | 0.23 |
| 11 | 1.00 | 2.00 | 3.00 | 38.0 | 0.02 | 0.05 | 0.04 | 0.20 |
| 12 | 0.97 | 1.98 | 3.00 | 80.5 | 0.02 | 0.03 | 0.01 | 0.07 |
| 13 | 1.01 | 2.02 | 3.00 | 42.4 | 0.02 | 0.03 | 0.03 | 0.11 |

The results were exceptionally close to the atomic ratios of the 1-2-3 Y-Ba-Cu powder, especially when consideration of the weight measurement error is included in the 10 gram Spex mill charges. Impurities included silicon, iron, calcium, strontium, aluminum and tantalum. Some of the hydrostatically extruded samples were then oxidized and tested for superconductivity. Both straight and bent samples were tested for critical current density ($J_c$). The straight samples were tested with voltage contacts spaced 3.5 cm and the bent samples were bent at room temperature around a 2 in. (5.1 cm) diameter mandrel prior to oxidation and had voltage contacts spaced at 0.7–0.9 cm. The critical superconducting transition values for the 1-2-3 Y-Ba-Cu superconductor are shown below in Table 3.

TABLE 3

| Sample No. | % Ag | Sheath Thickness (cm) | $T_c$ (°K.) | $I_c$ (77° K.) (Amp) | Straight $J_c$ (77° K.) (Amp/cm) | $I_c$ (77° K.) (Amp) | Bent $J_c$ (77° K.) (Amp/cm²) |
|---|---|---|---|---|---|---|---|
| 1 | 40 | 0.15 | 87 | — | 100 | — | — |
| 10 | 20 | 0.15 | 88 | 7.2 | 357 | 6.0 | 298 |
| | | | | 4.2 | 208 | 3.4 | 171 |
| 11 | 40 | 0.15 | 87 | 8.7 | 506 | 4.9 | 285 |
| | | | | 8.5 | 494 | 0 | 0 |
| 12 | 80 | 0.15 | n/m | 5.4 | 306 | 0 | 0 |
| | | | | 5.5 | 312 | 0 | 0 |
| 13 | 40 | 0.38 | n/m | 4.5 | 775 | 2.5 | 258 |
| | | | | 4.7 | 809 | 2.4 | 250 |
| 14 | 40 | 0.38 | 87 | 2.6 | 676 | 1.9 | 494 |
| | | | | 2.6 | 676 | 0.7 | 182 | n/m defines not measured.

The reduction in $J_c$ from straight to bent samples was believed to be caused by cracking of the precursor during cold bending. Samples 10–14 were then tested for hot ductility, as a possible means of reducing cracking during bending. To verify hot ductility, samples 10–14 were heated at various temperatures and bent around a 4 in. (10.2 cm) diameter bar. The bent sections were metallographically mounted and checked for signs of cracking. The number of cracks for samples bent at increasing temperatures is given below in Table 4.

TABLE 4

| Temp. (°C.) | Sample No. (No. of Cracks) | | | | |
|---|---|---|---|---|---|
| | 10 | 11 | 12 | 13 | 14 |
| 260 | 11 | 9 | 1 | 12 | 11 |
| 316 | 12 | 10 | 1 | 11 | 6 |
| 371 | 14 | — | 1 | 5 | 3 |
| 427 | 8 | 6 | 1 | 7 | 1 |
| 482 | 6 | 1 | 1 | 4 | 0 |
| 538 | 7 | 10 | 0 | 10 | 0 |
| 593 | 1 | 0 | 0 | 4 | 0 |

Superconducting properties of the oxide superconductor precursor were also measured after hot coiling. Hot coiling was conducted at 1100° F. (593° C.) using a 0.75 in. (1.9 cm) diameter mandrel. Cold coiling was processed at room temperature using a 1¼ in. (3.2 cm) diameter mandrel. Coiling results are given below in Table 5.

TABLE 5

| Sample No. | Turns | Length (cm) | Method | $I_c$ (77° K.) (Amp) | $J_c$ (77° K.) (Amp/cm$^2$) |
|---|---|---|---|---|---|
| 12 | 19 | 114 | Hot | 0 | 0 |
| 13 | 11 | 66 | Hot | 1.3 | 225 |
|  | 3.5 | 45 | Cold | 0.625 | 108 |
| 16 | 35 | 200 | Hot | 0.530 | 270 |
| 14 | 7 | 42 | Hot | 0 | 0 |
| 17 | 34 | 200 | Hot | 0.020 | 10 |

Samples 12 and 14 may have lacked superconducting properties because they may not have been oxidized properly. Hot coiling significantly increased superconducting properties in comparison to room temperature coiling. The best results were obtained with 40 weight percent silver. The 20 weight percent silver sample 10 was especially crack prone which decreased super-conductive properties. In addition, the 80% silver sample 12 was dilute in superconducting oxide, which reduced the super-conducting properties. It was noted that Sample 14 which was prepared under evacuated conditions rather than in an argon atmosphere, had superior mechanical properties to that of argon atmosphere prepared samples. In fact, samples prepared using a vacuum have less porosity and higher density which was believed to contribute to enhanced mechanical properties.

The oxide superconductor precursors have increased ductility at elevated temperatures. It has additionally been discovered that oxide superconductor precursors such as 1-2-3 Y-Ba-Cu oxide superconductor precursors may be hot worked. Samples 11, 12 and 14 all reached a temperature where the material could be hot bent without cracking, with sample 14 showing the best mechanical behavior. This may be related to the evacuation operation which may have reduced the porosity and, subsequently, crack initiation sites. The behavior of the 80% sample 12 was significantly different from the other samples. The material of sample 12 was strong but very brittle. Sample 12 had a tendency to completely break (including the sheath) at the highest stressed location. Samples 10, 11, 13 and 14 had cracks confined to the powder core. Accordingly, hot working an oxide superconductor precursor above 50%, preferably above 60% and most preferably above 75% of its melting temperature in degrees Kelvin contributes to increased workability of the precursor. For purposes of the specification, melting temperature is defined as the temperature of which a component of a superconductor precursor begins to transform from a solid state into a liquid state. For 1-2-3 Y-Ba-Cu samples, having a melting temperature of about 650° C., a temperature between 400° and 600° C. and most preferably a temperature between 550° C. and 600° C. is preferred for hot working.

EXAMPLE I

Six 10 gram charges were prepared for high energy Spex milling. Each of the lots were prepared with 1.619 g of −40 mesh (−420 micron) yttrium, 4.947 g of −0.25 in (−0.64 cm) barium and 3.434 of −100 mesh (−149 micron) copper to form six 10 gram lots. All samples were weighed under an argon atmosphere. Each lot was high energy Spex milled for 21 hours with three 0.5 in. (1.3 cm) diameter 440C steel balls in a chamber of 65.2 cm$^3$. After milling, the powder from the six lots was blended together. Samples of the blended powder weighing 10 g each were then placed in separate, clean Spex containers and mixed with an additional 7.0 g of −100 mesh (−149 micron) fine silver powder. Each Spex container was closed under the argon atmosphere and high energy Spex milled for an additional hour.

This high energy milled Y-Ba-Cu-Ag powder was then packed inside a fine silver (99.9% Ag) hydrostatic cylindrical extrusion can having a 0.62 in. (1.6 cm) outer diameter, 0.31 (0.79 cm) inner diameter and an inner core length of about 3.1 in. (7.9 cm). The main body of this can was fabricated by machining it out of a section of solid fine silver rod. The two disks were fabricated by punching them out of a piece of rolled fine silver stock 0.070 in. (0.18 cm) thick. The powder was loaded into the can by repeatedly loading a small amount of powder into the can and packing this powder in place using a hydraulic press. During this packing operation, the silver can was constrained inside the cavity of a split die in order to minimize barrelling of the can body. After packing, the two silver disks were placed on top of the powder column, and the uppermost one was welded in place using a gas tungsten arc torch. All powder filling and can welding operations were done under argon inside of a glove box. The final billet had a powder column approximately 2.75 in. (6.98 cm) long and contained 19.14 g of precursor material.

Example I was hydrostatically extruded at 600° F. (316° C.) using a 50 ton (45 metric ton) wire extruder with a ⅝ in. (1.6 cm) diameter bore. The pressure transfer agent was silicone-based oil and the sheath was extruded at a ram speed of 12 in. (30.5 cm) per minute through a 0.063 in. (0.16 cm) diameter aperture steel die having a 35° die angle. The extrusion ratio was 98 to 1. The original billet diameter was 0.62 in (1.6 cm) and 3.5 in. (8.9 cm) in length. After extrusion, at an average hydrostatic pressure of 82,000 psi (565 MPa) the superconductor precursor wire length was approximately 12 ft. (366 cm). The diameter of the superconductor precursor after extrusion was 0.031 in. (0.08 cm) and the 0.15 in (0.4 cm) silver sheath thickness was reduced to 0.016 in. (0.04 cm).

The extrudate was then hot coiled by wrapping 39 turns of superconductor wire around a 1.25 in. (3.2 cm) diameter nickel mandrel located in an 1100° F. (593° C.) air atmosphere furnace. A typical electron diffraction analysis (EDAX) of the matrix was 36.77% Ag, 33.84% Cu, 20.48% Ba and 8.92% Y. Some $Cu_6Y$ particles, as well as some copper stringers were observed in the microstructure. Trace amounts of Ta, Fe and Cr were also detected.

The coiled oxide superconductor precursor was oxidized per the procedure of U.S. Pat. No. 4,826,808. The resulting superconducting properties were as follows:

Onset $T_c$ of 89° K.
Zero Resistivity at 87° K.
$J_c$ of 400 A/cm$^2$
$I_c$ of 2.0 A
$J_c \times L$ (length) of $1.6 \times 10^5$ A/cm
$I_c \times N$ (number of turns) of 78 Amp-turns All of the above superconducting properties were measured at 77° K. with no magnetic field (B=0). Onset $T_c$ and Zero Resistivity were measured on straight samples.

EXAMPLE II

Eight 10 gram charges were prepared for high energy Spex milling. Each of the lots were prepared with 1.619 g of −40 mesh (−420 micron) yttrium, 4.947 g of −0.25 in. (−0.64 cm) barium and 3.434 g of −100 mesh (−149 micron) copper. The eight charges were weighed within an argon atmosphere glove box. The powders were high energy milled in hardened steel vials with three 0.5 in (1.3 cm) 440C steel balls for 21 hours. The powder from the eight lots was then mixed together. Samples of the blended powder weighing 6.0 g each were then placed in separate clean Spex containers and mixed with an additional 4.0 g of −100/+325 mesh fine silver (99.9% Ag) powder. The containers were then sealed under argon, and high energy milled for 1 hour.

A total of 29.60 g of milled Y-Ba-Cu-Ag powder was then packed inside fine silver (99.9% Ag) hydrostatic extrusion cans having a 0.62 in (1.6 cm) outer diameter, a 0.42 in. (1.1 cm) inner diameter and an inner core length of about 3.25 in. (8.3 cm). These cans were also machined out of solid fine silver rod, and the disks were punched out of rolled fine silver stock 0.070 in. (0.18 cm) thick. The powder was loaded into each can by repeatedly pouring a small amount of powder into the cavity and then tightly tamping this powder in place by hand. After packing, the two silver disks were placed on top of the powder column, and the uppermost disk was welded in place using a gas tungsten arc torch. A small amount of silver solder was used while making this weld to ensure adequate filling of the weld joint. All powder filling and can welding operations were done under argon inside a glove box system.

Example II was hydrostatically extruded at 600° F. (316° C.) using a 50 ton (45 metric ton) wire extruder with a ⅝ in. (1.6 cm) diameter bore. The pressure transfer agent was silicone-based oil and the sheath was extruded at a speed of 12 in. (30.5 cm) per minute through a 0.078 in. (0.20 cm) diameter aperture steel die having a 35° die angle. The extrusion ratio was 63 to 1. The billet was extruded at an average hydrostatic pressure of 70 Ksi (483 MPa). The original billet diameter was 0.62 in. (1.6 cm) and and had a length of 3.875 in. (9.8 cm). The final diameter of the core was 0.044 in. (0.11 cm) and the final sheath wall thickness was 0.017 in. (0.043 cm).

The extrudate was then hot coiled by wrapping 20 turns of superconductor wire around a 1.25 in. (3.2 cm) diameter nickel mandrel in an air atmosphere furnace at 1100° F. (593° C.). The coiled wire was oxidized per the procedure described in U.S. Pat. No. 4,826,808. The resulting superconducting properties were as follows:

Onset $T_c$ of 89° K.
Zero Resistivity at 87° K.
$J_c$ of 500 A/cm$^2$
$I_c$ of 5.0 A
$J_c \times L$ (length) of $1.0 \times 10^5$
$I_c \times N$ (number of turns) of 100 Amp-turns All of the above superconducting properties were measured at 77° K. with no magnetic field (B=0). Onset $T_c$ and Zero Resistivity were measured on straight samples.

The method of the invention has proven to be an effective process of forming and working oxide superconductor precursors. The method of the invention is especially effective for rare earth-Ba-Cu superconductors and silver-containing oxide superconductor precursors. Practical applications for product produced by the method of the invention include motor windings, test coils, actuators, magnetostrictor coils, superconducting cables and vapor-cooled leads.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. A process for production of a silver-containing superconductor precursor having reduced amounts of intermetallics comprising:
   (a) high energy milling alloying powders containing metallic elemental components of an oxide superconductor for a predetermined amount of time to increase homogeneity of said metallic elemental components of said oxide superconductor;
   (b) high energy milling silver into said milled metallic components of said oxide superconductor to mix said silver into said metallic elemental components of said oxide superconductor;
   (c) compacting said milled silver and metallic elemental components of said oxide superconductor; and
   (d) working said compacted silver and metallic elemental components of said oxide superconductor to form the silver-containing superconductor precursor.

2. The process of claim 1 wherein said high energy milling of steps (a) and (b) include mechanical alloying.

3. The process of claim 1 wherein said milled silver and metallic elemental components are compacted within a silver sheath.

4. The process of claim 1 wherein said working consists of hydrostatic extrusion.

5. The process of claim 1 wherein step (d) is conducted at temperatures of at least 50% of the silver-containing superconducting precursors melting temperature in degrees Kelvin.

6. The process of claim 1 further including the step of hot working the silver-containing superconducting precursor alloy into a predetermined shape.

7. The process of claim 1 wherein said silver-containing superconducting precursor alloy additionally includes at least one rare earth, barium and copper.

8. The process of claim 1 wherein said metallic elemental components of said oxide superconductor include yttrium, barium and copper.

9. A process of forming a superconducting object comprising:
   (a) forming an oxide superconductor precursor alloy;
   (b) hot working said oxide superconductor precursor by hydrostatic extrusion at a temperature of at least 50% of said oxide superconductor precursor alloy's melting temperature in degrees Kelvin to form an oxide superconductor precursor alloy of a desired shape; and
   (c) oxidizing said oxide superconductor precursor alloy to provide the superconducting object.

10. The process of claim 9 wherein said oxide superconductor precursor alloy is formed into a wire.

11. The process of claim 9 wherein said hydrostatic extrusion is conducted at a temperature above 316° C.

12. The process of claim 10 wherein said oxide superconductor precursor is hot coiled after said hot working by hydrostatic extrusion.

13. The process of claim 9 wherein said oxide superconductor precursor alloy is contained within a silver sheath.

14. The process of claim 9 wherein said oxide superconductor precursor alloy includes at least one rare earth, barium and copper.

15. The process of claim 14 wherein said hot working is at a temperature between 450° C. and 600° C.

16. The process of claim 9 wherein said hot working is conducted at least 75% of said oxide superconductor precursor alloy's melting temperature in degrees Kelvin.

17. The process of claim 9 wherein said oxide superconductor precursor alloy is formed by mechanical alloying.

18. A process of forming a superconducting object comprising:
  (a) forming an oxide superconductor precursor alloy which includes at least one rare earth, barium and copper into a superconductor precursor wire;
  (b) hot coiling said superconductor precursor wire at a temperature between 450° C. and 600° C. to form a coil of said superconductor precursor wire; and
  (c) oxidizing said coil of said superconductor precursor wire to form a superconducting coil.

19. The process of claim 18 wherein said precursor alloy is formed by mechanical alloying.

20. The process of claim 18 wherein said oxide superconductor precursor includes silver.

* * * * *